(12) United States Patent
Hsu et al.

(10) Patent No.: US 8,940,600 B2
(45) Date of Patent: Jan. 27, 2015

(54) METHOD FOR FABRICATING SEMICONDUCTOR DEVICE

(71) Applicant: United Microelectronics Corp., Hsin-Chu (TW)

(72) Inventors: Chun-Wei Hsu, Taipei (TW); Po-Cheng Huang, Kaohsiung (TW); Ren-Peng Huang, Changhua County (TW); Jie-Ning Yang, Pingtung County (TW); Chia-Lin Hsu, Tainan (TW); Teng-Chun Tsai, Tainan (TW); Chih-Hsun Lin, Ping-Tung County (TW); Chang-Hung Kung, Kaohsiung (TW); Yen-Ming Chen, New Taipei (TW); Yu-Ting Li, Chiayi (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/294,152

(22) Filed: Jun. 3, 2014

(65) Prior Publication Data

US 2014/0273371 A1 Sep. 18, 2014

Related U.S. Application Data

(62) Division of application No. 13/283,603, filed on Oct. 28, 2011, now Pat. No. 8,779,526.

(51) Int. Cl.
*H01L 27/06* (2006.01)

(52) U.S. Cl.
CPC .................. *H01L 27/0629* (2013.01)
USPC ......................................................... 438/238

(58) Field of Classification Search
CPC ............................ H01L 27/0629; H01L 28/20
USPC ................. 257/379, 380, 510, 516, 536, 538, 257/E21.004, E27.016, E27.025, E27.035; 438/238, 382, 384, 385
See application file for complete search history.

(56) References Cited

U.S. PATENT DOCUMENTS

| | | | |
|---|---|---|---|
| 7,994,576 B2 | 8/2011 | Tseng | |
| 8,125,051 B2 | 2/2012 | Chuang | |
| 2007/0046421 A1 | 3/2007 | Gogineni | |
| 2010/0059823 A1 | 3/2010 | Chung | |
| 2010/0320544 A1 | 12/2010 | Tseng | |
| 2011/0318897 A1 | 12/2011 | Shang | |
| 2012/0205776 A1 | 8/2012 | Kemerer | |
| 2013/0015531 A1* | 1/2013 | Kim et al. | 257/380 |

* cited by examiner

*Primary Examiner* — Daniel Shook
(74) *Attorney, Agent, or Firm* — Winston Hsu; Scott Margo

(57) ABSTRACT

A method for fabricating semiconductor device is disclosed. The method includes the steps of: providing a substrate having a transistor region and a resistor region; forming a shallow trench isolation (STI) on the resistor region of the substrate; forming a tank in the STI; and forming a resistor in the tank and on two sides of the top surface of the STI outside the tank.

8 Claims, 9 Drawing Sheets

METHOD FOR FABRICATING SEMICONDUCTOR DEVICE

CROSS REFERENCE TO RELATED APPLICATIONS

This application is a division of U.S. application Ser. No. 13/283,603 filed Oct. 28, 2011, and incorporated herein by reference in its entirety.

BACKGROUND OF THE INVENTION

1. Field of the Invention

The invention relates to a method for fabricating a semiconductor device, and more particularly, to a method for integrating metal gate transistor and polysilicon resistor.

2. Description of the Prior Art

With a trend towards scaling down size of the semiconductor device, conventional methods, which are used to achieve optimization, such as reducing thickness of the gate dielectric layer, for example the thickness of silicon dioxide layer, have faced problems such as leakage current due to tunneling effect. In order to keep progression to next generation, high-K materials are used to replace the conventional silicon oxide to be the gate dielectric layer because it decreases physical limit thickness effectively, reduces leakage current, and obtains equivalent capacitor in an identical equivalent oxide thickness (EOT).

On the other hand, the conventional polysilicon gate also has faced problems such as inferior performance due to boron penetration and unavoidable depletion effect which increases equivalent thickness of the gate dielectric layer, reduces gate capacitance, and worsens a driving force of the devices. Thus work function metals are developed to replace the conventional polysilicon gate to be the control electrode that competent to the high-K gate dielectric layer.

However, there is always a continuing need in the semiconductor processing art to develop semiconductor device renders superior performance and reliability even though the conventional silicon dioxide or silicon oxynitride gate dielectric layer is replaced by the high-K gate dielectric layer and the conventional polysilicon gate is replaced by the metal gate. Hence, how to successfully integrate the fabrication of a conventional work function metal gate transistor with other passive devices such as capacitors and resistors has become an important study in the field.

SUMMARY OF THE INVENTION

It is an objective of the present invention to provide a method for integrating metal gate transistor and polysilicon resistor.

According to a preferred embodiment of the present invention, a method for fabricating semiconductor device is disclosed. The method includes the steps of : providing a substrate having a transistor region and a resistor region; forming a shallow trench isolation (STI) on the resistor region of the substrate; forming a tank in the STI; and forming a resistor in the tank and on two sides of the top surface of the STI outside the tank.

Another aspect of the present invention provides a semiconductor device, which includes: a substrate having a transistor region and a resistor region; a shallow trench isolation (STI) on the substrate of the resistor region; a tank in the STI of the resistor region; and a resistor in the tank and on the STI adjacent to two sides of the tank.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
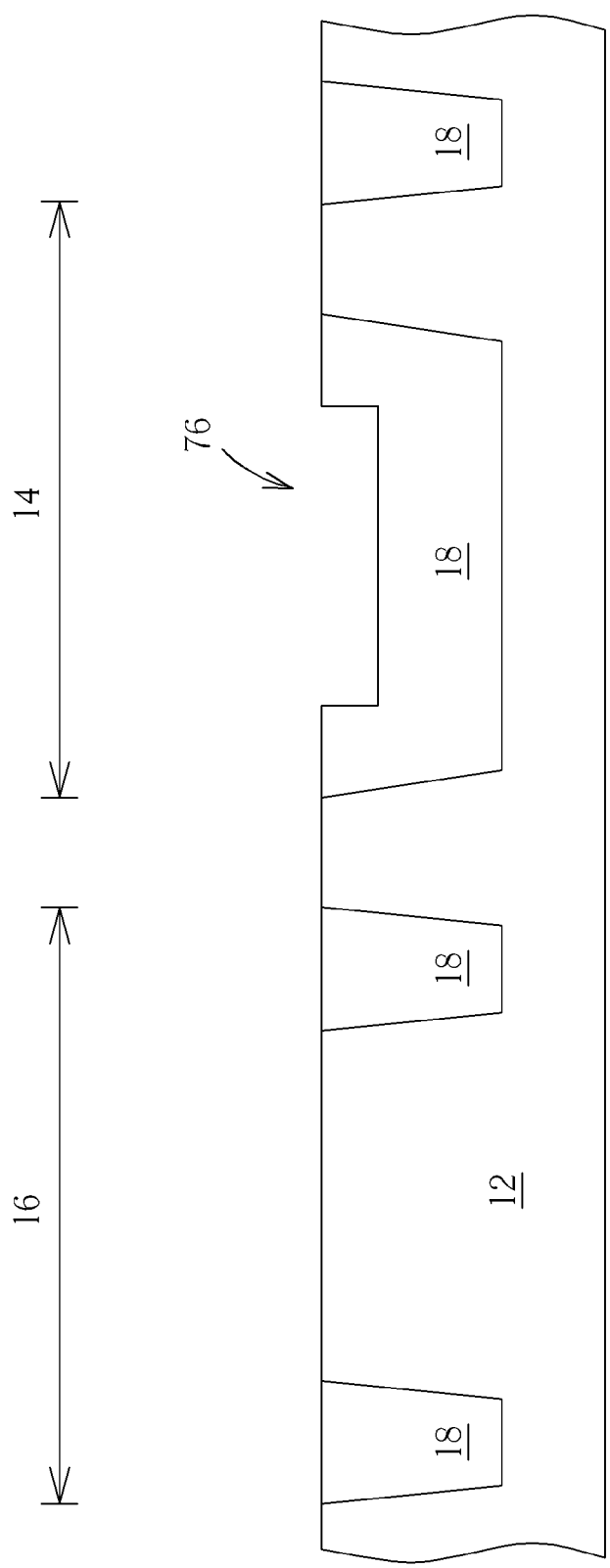
FIGS. 1-9 illustrate a method for fabricating a semiconductor device having metal gate and polysilicon resistor according to a preferred embodiment of the present invention.

Referring to FIGS. 1-8, FIGS. 1-8 illustrate a method for integrating a polysilicon resistor and a metal gate transistor according to a preferred embodiment of the present invention. As shown in FIG. 1, a substrate 12, such as a silicon substrate or a silicon-on-insulator (SOI) substrate is provided. A resistor region 14 and a transistor region 16 are defined on the substrate 12 and a shallow trench isolation (STI) 18 is formed in the substrate 12 of the resistor region 14 and transistor region 16. Fabrication of the STI 18 typically involves the following steps: selectively covering a buffer layer (such as a thin oxide) on the substrate 12 and disposing a hard mask (such as silicon nitride) thereafter; defining the shallow trench isolation 18 region through a photolithography process, and utilizing an etching process to form a recess in the substrate 12; forming an insulating material (such as silicon nitride) to fill the recess utilized for defining the shallow trench isolation 18; selectively conducting a thermal treatment under an oxygen-containing environment to increase the density of the insulating material while repairing the entire structure; planarizing the excess insulating material through a chemical mechanical polishing (CMP) process to expose the substrate 12.

Next, a patterned hard mask, such as a silicon nitride hard mask is formed on the previous hard mask and the substrate 12 to partially expose the STI 18 of the resistor region 14. An etching process is then carried out by using this patterned hard mask as mask to partially remove the STI 18 of the resistor region 14 till a predetermined depth for forming a tank 76 in the STI 18. This etching process could be a dry etching process, a wet etching process, or a combination of both, and the etching process could be a single etching process (conducted in the same equipment) or a combination of series of etching processes (such as conducted in same or different equipment) . The patterned hard mask and the previous hard mask are stripped after the tank 76 is formed. Typically, the top surface of the shallow trench isolation 18 obtained after removing the hard mask is substantially higher than the top surface of the substrate 12. For illustration purpose, this height difference is not revealed in the following figures. However, it should be noted that the top surface of the shallow trench isolation 18 would change throughout the fabrication process.

Figure 2:
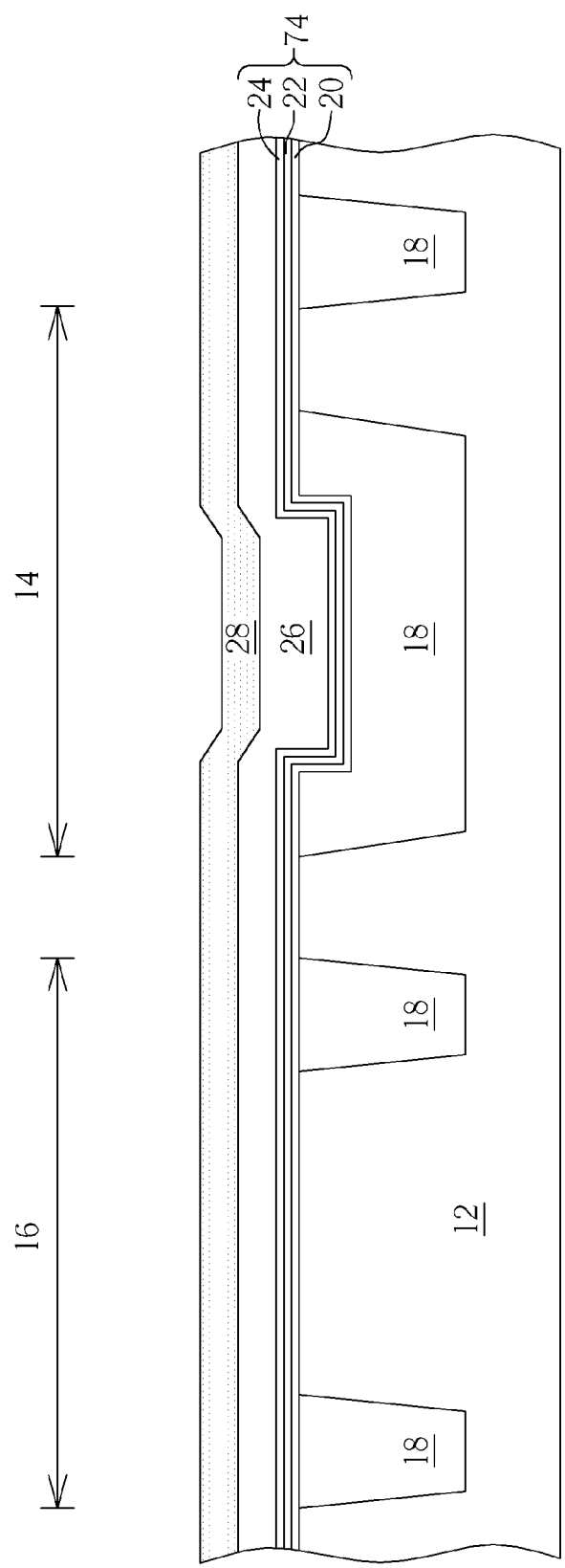

Next, as shown in FIG. 2, a stacked film 74 composed of a selective interfacial layer 20 consisting of dielectric material such as oxides or nitrides, a high-k dielectric layer 22, a selective cap layer (not shown) , and a barrier layer 24 is deposited on the substrate 12, and a polysilicon layer 26 is formed on the stacked film 74. The interfacial layer 20 is preferably a single layered structure, but could also be composed of a multiple layered structure, such as consisting of an oxide layer and a high-k dielectric layer 22 addressed above.

In this embodiment, the high-k dielectric layer 22 could be a single-layer or a multi-layer structure containing metal oxide layer such as rare earth metal oxide, in which the dielectric constant of the high-k dielectric layer 22 is substantially greater than 20. For example, the high-k dielectric layer 22 could be selected from a group consisting of hafnium oxide ($HfO_2$), hafnium silicon oxide (HfSiO), hafnium silicon oxynitride (HfSiON), aluminum oxide (AlO), lanthanum oxide ($La_2O_3$), lanthanum aluminum oxide (LaAlO), tantalum oxide, $Ta_2O_3$, zirconium oxide ($ZrO_2$), zirconium silicon oxide (ZrSiO), hafnium zirconium oxide (HfZrO), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). The cap layer could be consisting of a combination selected from LaO and $Dy_2O_3$, the barrier layer 24 is composed of TiN, and the polysilicon layer 26, being used as a sacrificial layer, could be composed of undoped polysilicon, polysilicon having n+ dopants, or amorphous polysilicon material.

Next, an ion implantation is performed to implant boron atoms into the polysilicon layer 26 till a predetermined depth such that part of polysilicon layer 28, preferably the upper portion, is implanted with dopants while the lower portion of the polysilicon layer 26 is undoped. Preferably, the thickness of the undoped polysilicon layer 26 is substantially less than the depth of the tank 76 in the STI 18.

Figure 3:
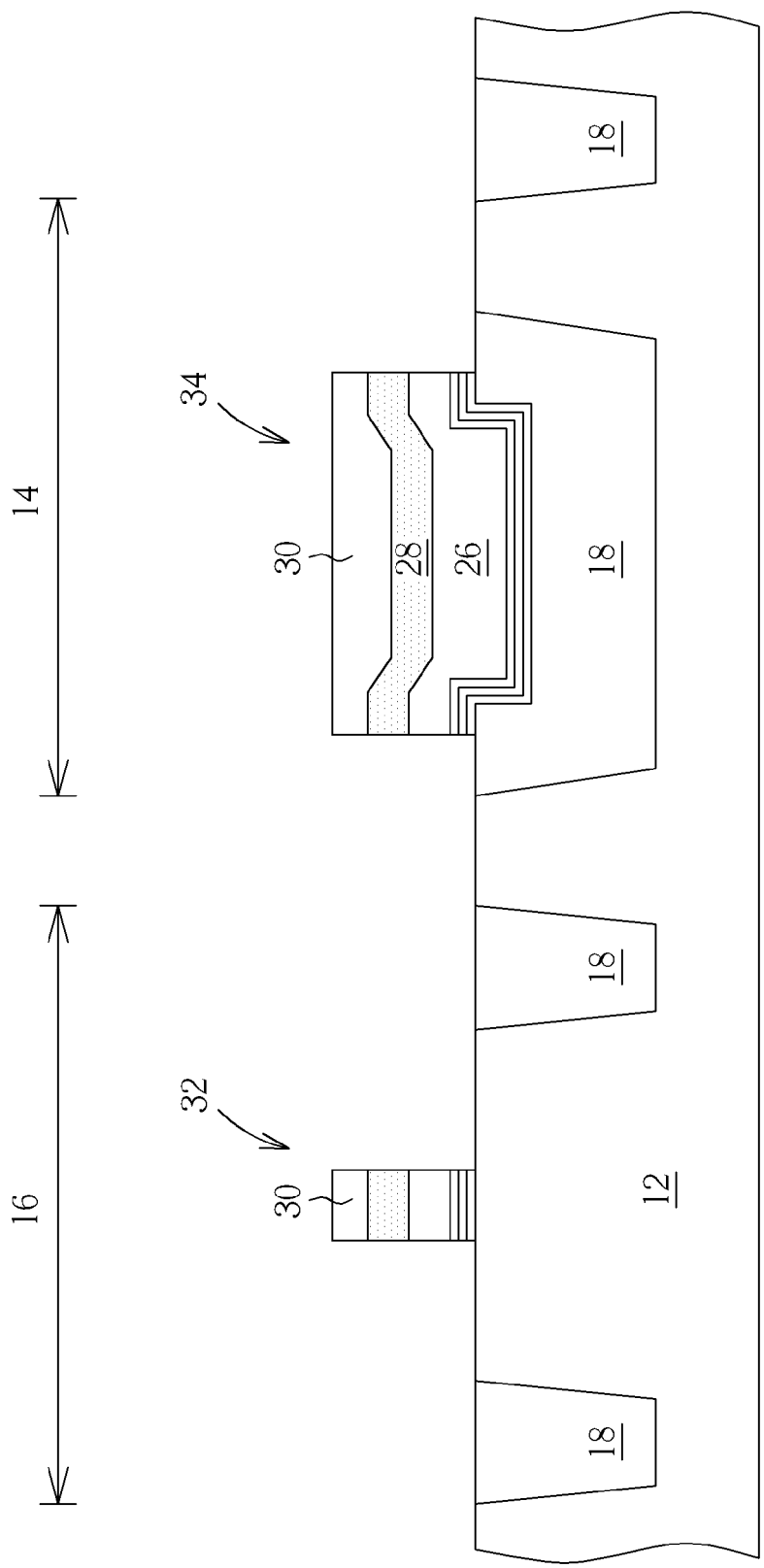

As shown in FIG. 3, a hard mask 30 is formed on the entire polysilicon layer 28, and a patterned resist (not shown) is formed on the hard mask 30. A patterned transfer is then carried out by using the patterned resist as mask to partially remove the hard mask 30, the polysilicon layer 28/26, and the stacked film 74 through single or multiple etching processes to form a polysilicon resistor 34 in the resistor region 14 and a dummy gate 32 in the transistor region 16. In this embodiment, the hard mask 30 is composed of $SiO_2$, SiN, SiC, or SiON, and the polysilicon resistor 34 is formed not only in the tank 76 but also on the STI 18 adjacent to two sides of the tank 76.

Figure 4:
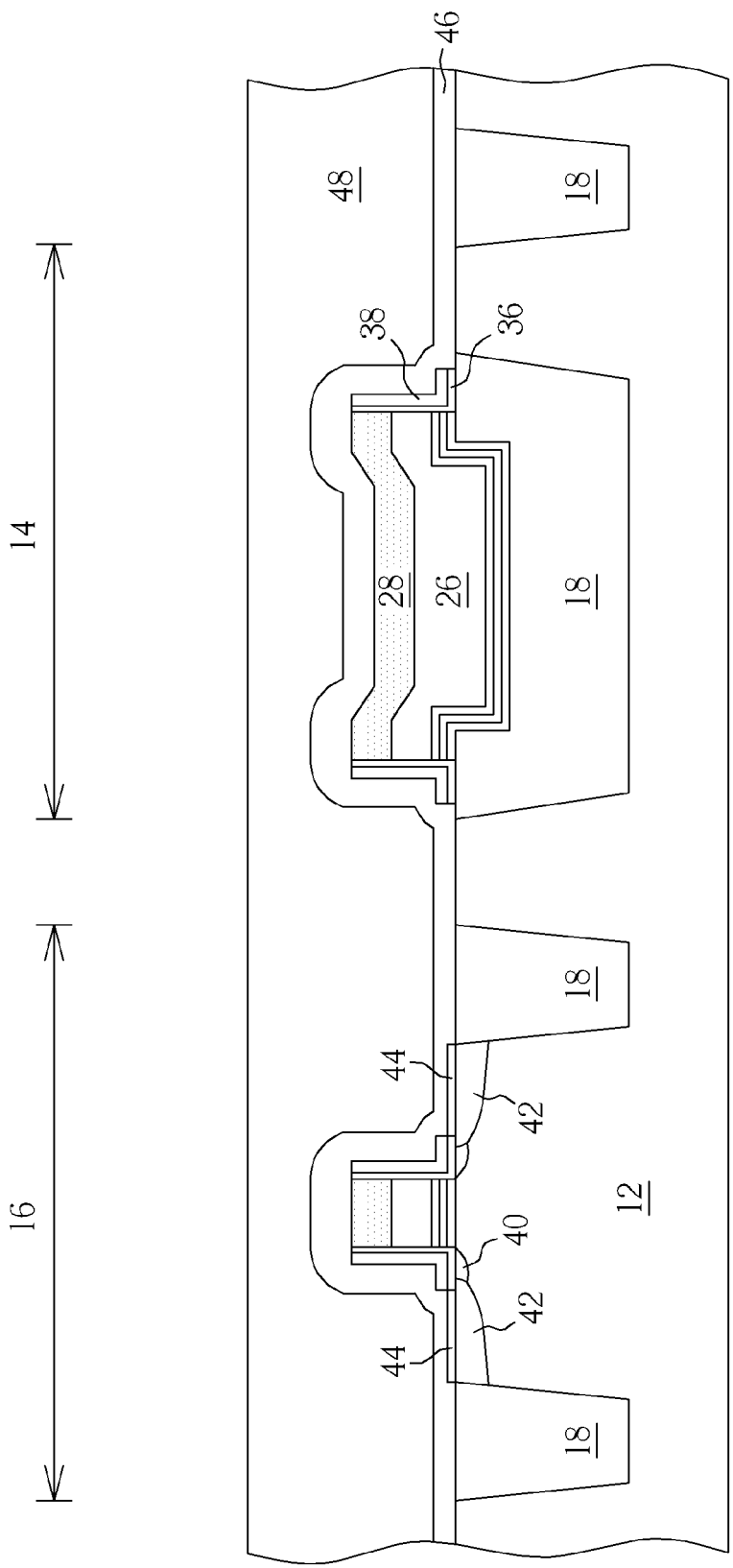

Next, as shown in FIG. 4, a first spacer 36 and a second spacer 38 are formed on the sidewalls of the dummy gate 32 and the polysilicon resistor 34, and a lightly doped drain 40 and source/drain 42 are formed in the substrate 12 adjacent two sides of the first spacer 36 and second spacer 38 of the transistor region 16.

A selective epitaxial growth process is carried out in the transistor region 16, such as to form two recesses in the substrate 12 adjacent to two sides of the second spacer 38 of the transistor region 14 and then form an epitaxial layer (not shown) composed of SiGe or SiC accordingly. In this embodiment, the epitaxial layer preferably includes silicon germanium, and the epitaxial layer could be formed by following approaches: selective epitaxial growth process through single or multiple layer approach; SEG process accompanying in-situly doping with progression (such as the most bottom layer with no dopants at all, the first layer with slight dopant, the second layer with dopants of higher concentration, the third layer with dopants of high concentration . . . , and the top layer with no dopants at all or slight dopant concentration); alteration of the concentration of hetero atoms (such as the atom Ge in this case), in which the concentration thereof could be altered according to the constant and surface property of the lattice structure while the surface of the lattice would expect to have a lower concentration of Ge atoms or no Ge atoms at all to facilitate the formation of salicides afterwards. Moreover, despite the ion implant for the source/drain 42 of the present embodiment is conducted before the formation of the epitaxial layer, the ion implant could also be performed after the epitaxial layer is formed or at the same time (in-situly) with the formation of the epitaxial layer.

Next, a salicide process is performed by first forming a metal selected from a group consisting of cobalt, titanium, nickel, platinum, palladium, and molybdenum on the substrate 12 and the source/drain 42, and then using at least one rapid thermal anneal process to react the metal with epitaxial layer and the source/drain 42 for forming a silicide layer 44. The un-reacted metal is removed thereafter.

After selectively removing the hard mask 30, a contact etch stop layer (CESL) 46 is formed on the surface of the substrate 12 to cover the dummy gate 32 and the polysilicon resistor 34, and an interlayer dielectric (ILD) layer 48 is formed on the substrate 12 to cover the CESL 46. In this embodiment, the CESL 46 is preferably composed of silicon nitride, which could have different types of stress in corresponding transistor region 16. The interlayer dielectric layer 48 is composed of silicon oxide and the thickness thereof is between 1500-5000 Angstroms and preferably at about 3000 Angstroms.

Figure 5:
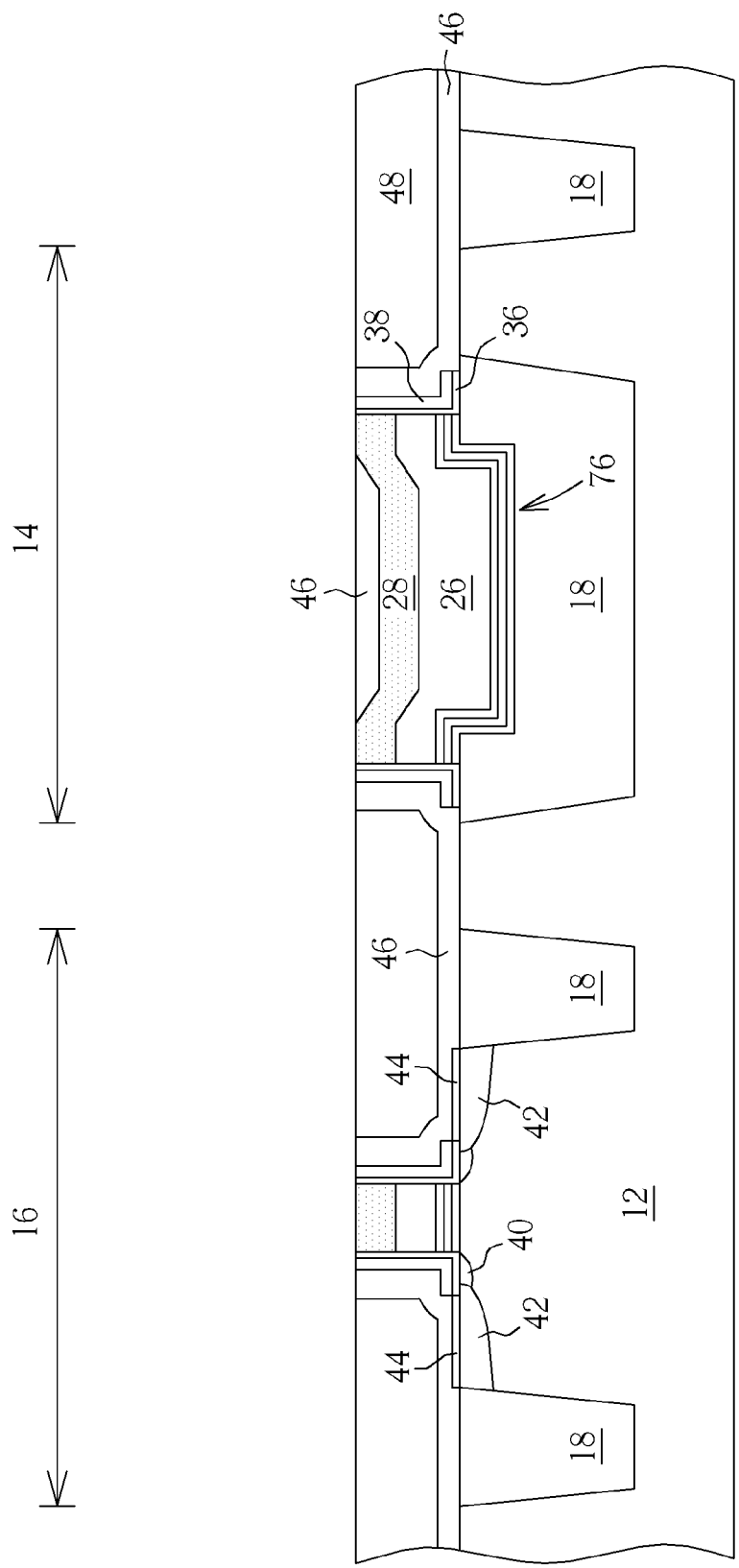

Next, as shown in FIG. 5, a planarizing process, such as a chemical mechanical polishing (CMP) process is performed to partially remove the interlayer dielectric layer 48 and the CESL 46 so that part of the CESL 46 still covers the dummy gate 32 and the polysilicon resistor 34. An etching back is carried out thereafter to partially remove the interlayer dielectric layer 48 and the CESL 46 in both transistor region 16 and resistor region 14 until exposing the surface of the dummy gate 32 and the doped polysilicon layer 28 doped with boron adjacent to two sides of the tank 76 in the resistor region 14.

Figure 6:
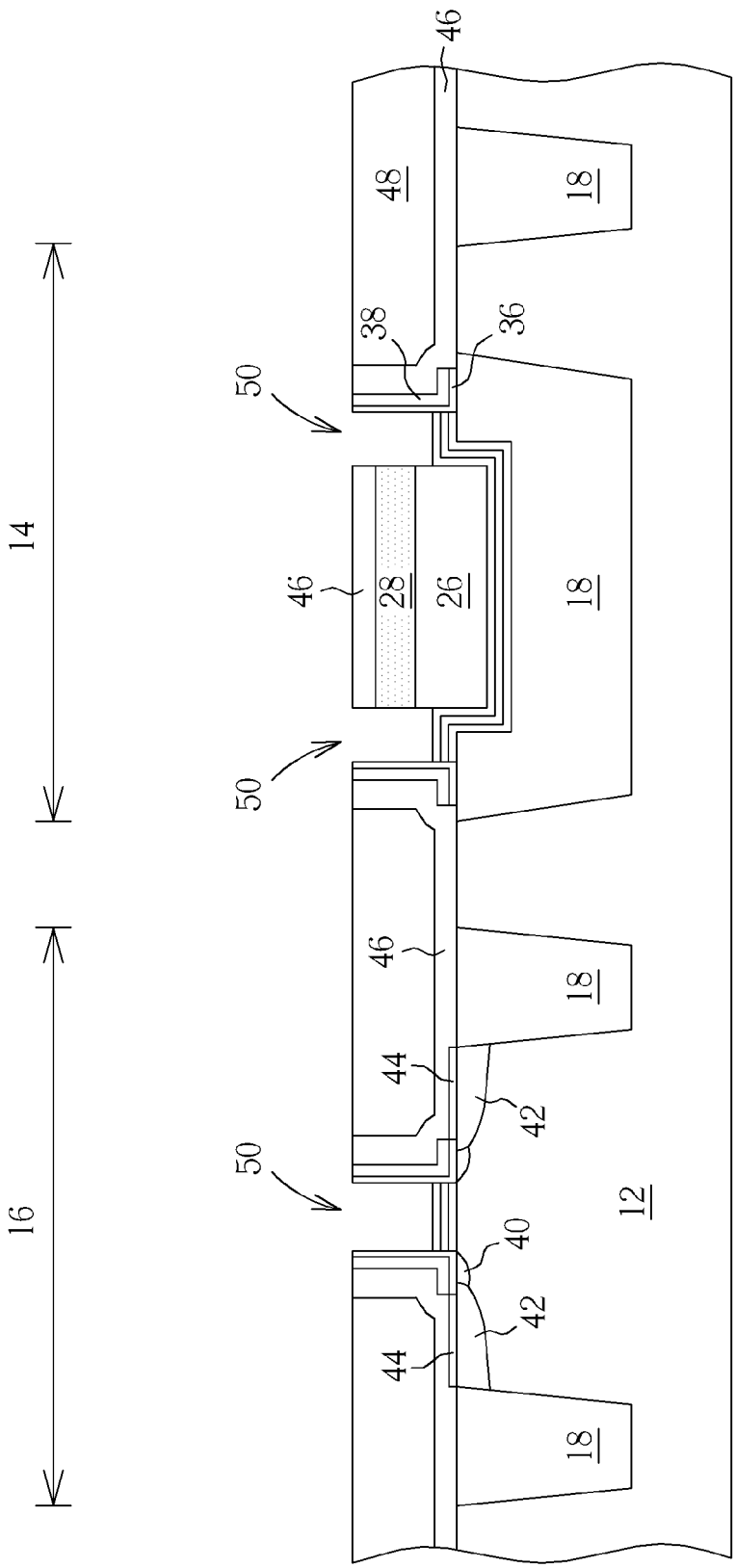

As shown in FIG. 6, a dry etching process is performed to partially remove the polysilicon layer in the transistor region 16 and the resistor region 14, particularly the doped polysilicon layer 28 in the dummy gate 32 of the transistor region 16 and the doped polysilicon layer 28 adjacent to two sides of the tank 76 in the resistor region 14. Next, a wet etching process is carried out to remove the remaining polysilicon layer 26 in the dummy gate 32 and adjacent to two sides of the tank 76 for forming a plurality of openings 50. As a tank 76 is formed in the STI 18 of the resistor region 14 and boron atoms are implanted into part of the polysilicon layer to form a doped polysilicon layer 28, different etching selectivity is created between the doped polysilicon layer 28 and adjacent undoped polysilicon layer 26. Accordingly, the polysilicon layer 26 could be removed from the openings 50 through wet etching process while no lateral over-etching is affecting the doped polysilicon layer 28.

Figure 7:
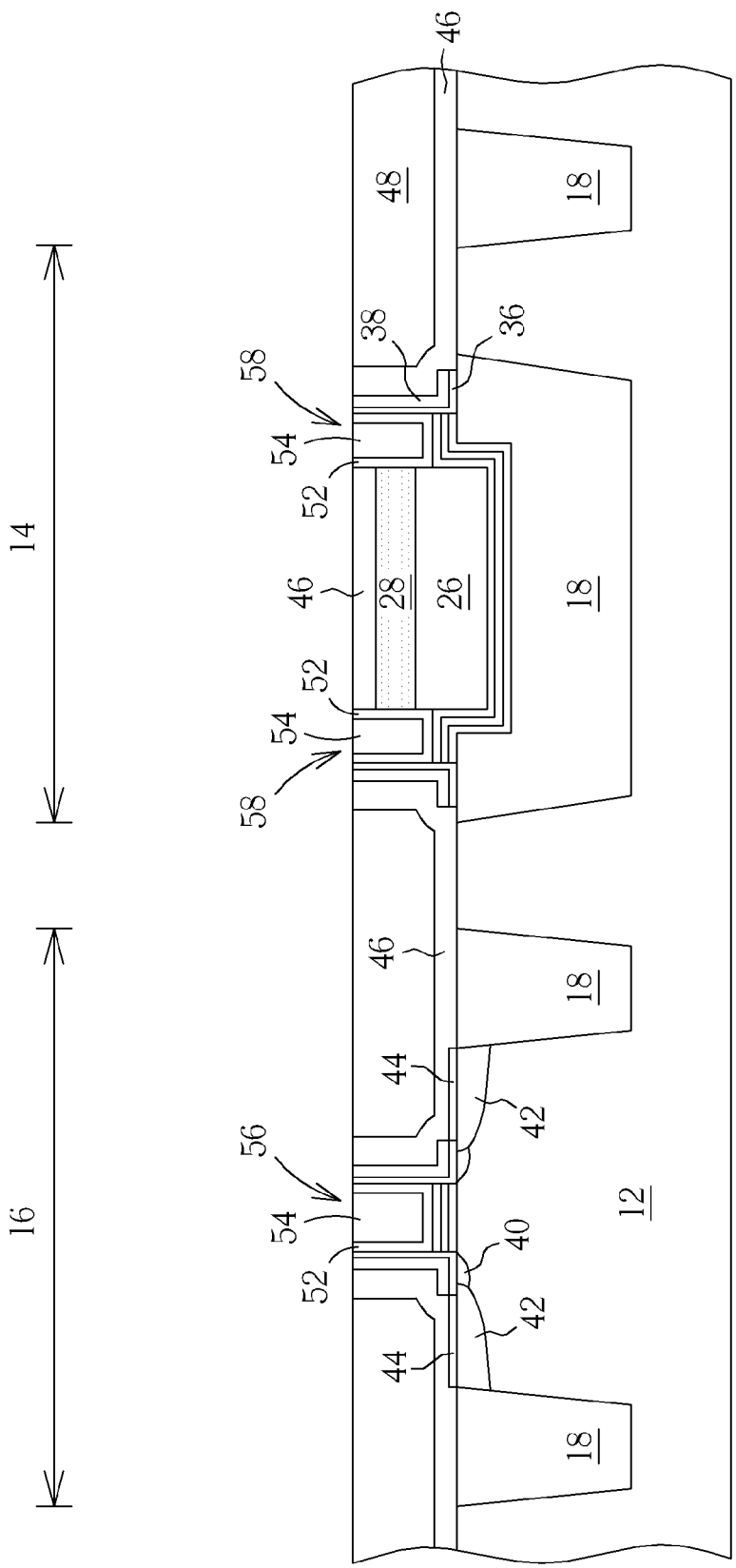

Next, as shown in FIG. 7, a work function metal layer 52 and a conductive layer 54 with low resistance are formed to fill the openings 50, and a planarizing process, such as a CMP process is carried out to partially remove the work function metal layer 52 and the conductive layer 54 for forming a metal gate 56 and two contacts 58 connecting the polysilicon resistor 34. It should be noted that as the work function metal layer 52 is first deposited on the sidewalls of each opening 50, each of the metal gate 56 and the contacts 58 fabricated according to the same process would include a U-shaped work function metal layer 52 and a conductive layer 54.

In this embodiment, the work function metal layer 52 could be consisting of n-type work function metal or p-type work function metal according to nature of the transistor being fabricated. For instance, if the transistor being fabricated in the transistor region 16 is a PMOS transistor, the metal layer 52 could be selected from a group consisting of TiN and TaC, but not limited thereto. If the transistor being fabricated is a NMOS transistor, the metal layer 52 is selected from a group consisting of TiAl, ZrAl, WAl, TaAl, and HfAl, but not limited thereto. The conductive layer 54 on the other hand is selected from a group consisting of Al, Ti, Ta, W, Nb, Mo, Cu, TiN, TiC, TaN, Ti/W, and composite metal such as Ti/TiN, but not limited thereto.

Figure 8:
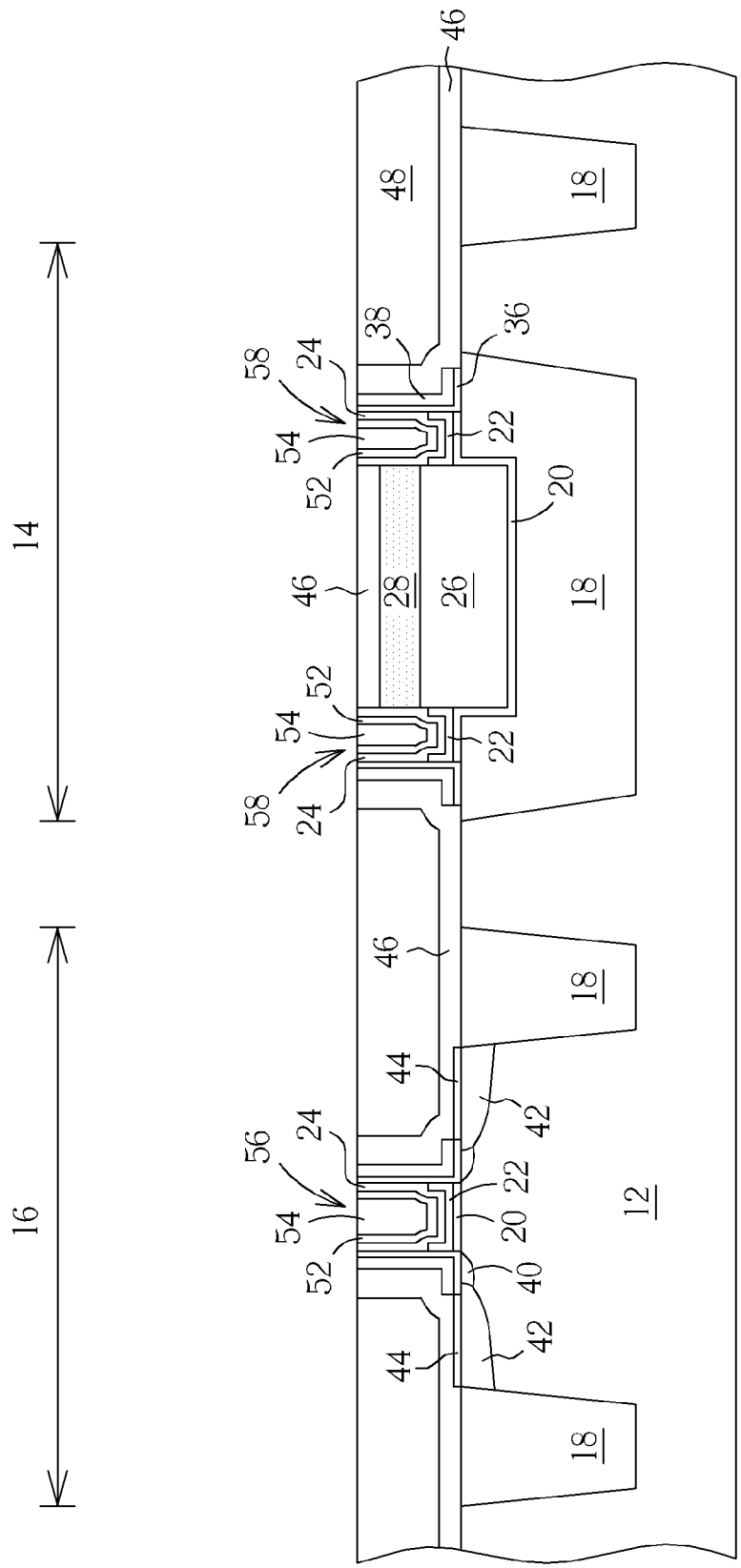

It should be noted that despite the aforementioned embodiment applies to a high-k first process, the present invention could also be applied to a high-k last process. For instance, as shown in FIG. 8, a dummy gate and polysilicon resistor from FIG. 3 could be first formed on a substrate 12, in which the dummy gate and the polysilicon resistor include an interfacial layer, a polysilicon layer, and a hard mask, but without a high-k dielectric layer and barrier layer. Next, following the process carried out from FIG. 4, a first spacer 36 and a second spacer 38 are formed around the dummy gate and the polysilicon resistor, a lightly doped drain 40 and a source/drain 42 are formed in the substrate 12 adjacent to two sides of the first spacer 36 and second spacer 38, a CESL 46 and an interlayer dielectric layer 48 are formed on the substrate 12, a planarizing process is performed to partially remove the CESL 46 and the interlayer dielectric layer 48 while removing polysilicon layer from the dummy gate and adjacent to sides of the tank of the resistor region for forming a plurality of openings 50. Next, as shown in FIG. 8, a high-k dielectric layer 22 is deposited on the bottom and sidewall of the openings 50 in both the transistor region 16 and the resistor region 14, and a blocking layer, such as a patterned resist (not shown) with height approximately one third of the opening 50 is formed on the high-k dielectric layer 22 within the openings 50. An etching process is then carried out by using the patterned resist as mask to remove the high-k dielectric layer 22 not covered by the patterned resist for forming a substantially U-shaped high-k dielectric layer 22 in the bottom of the openings 50.

After stripping the patterned resist, a barrier layer 24, a work function metal layer 52, and a conductive layer 54 with low resistance are deposited to fill the openings 50. A planarizing process, such as a CMP process is then conducted to partially remove the barrier layer 34, the work function metal layer 52, and the conductive layer 54 for forming a metal gate 56 in the transistor region 16 and two contacts 58 in the resistor region 14. This completes the process of a high-k last embodiment.

Figure 9:
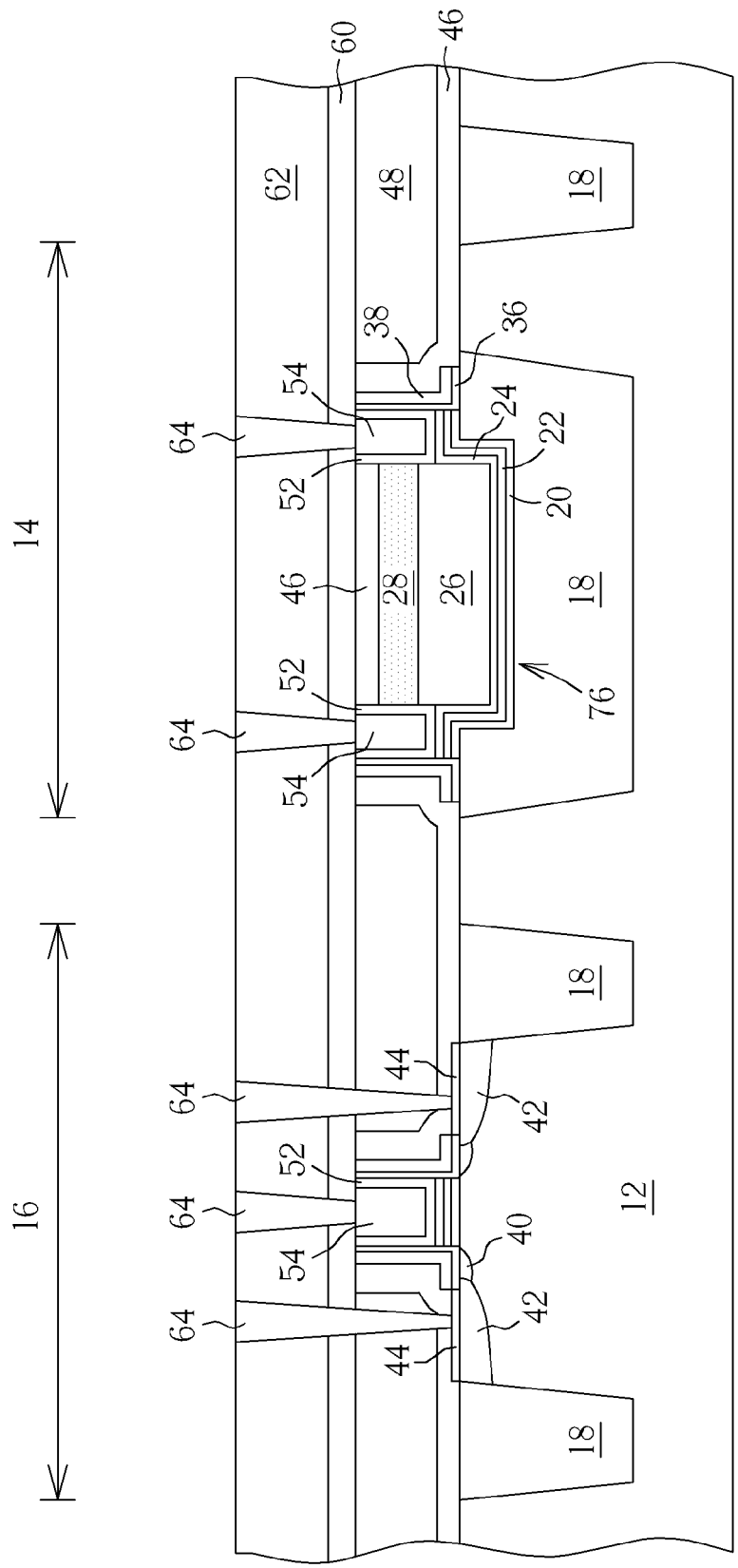

Next, as shown in FIG. 9, after completing the metal gate 56 and the contacts 58 a passivation layer 60 could be formed selectively on the interlayer dielectric layer 48, and another dielectric layer 62 is formed on the passivation layer 60 thereafter. in this embodiment, the passivation layer 60, consisting of TiAlO or SiCN, preferably protects the conductive material in the metal gate 54 and the contacts 58. Next, a contact plug fabrication is performed to form a plurality of contact plugs 64 in the passivation layer 60 and dielectric layer 62 for connecting the metal gate 54 and source/drain 42 in the transistor region 16 and contacts 58 in the resistor region 14. This completes the fabrication of a semiconductor device according to a preferred embodiment of the present invention.

Current approach for integrating metal gate transistor and polysilicon resistor typically involves two problems: a lateral over-etching caused by height difference of the hard mask on the polysilicon layer while forming the openings of the resistor contacts, and conductive residue remained by the same height difference of the hard mask while conductive materials are deposited in the openings. Hence, the present invention first forms a tank in the STI of the resistor region while the dummy gate and polysilicon resistor are patterned, so that the polysilicon resistor in the tank of the STI and the contacts adjacent to the tank, despite being on different horizon, are even with the top of the metal gate. Secondly, ion implantations are conducted to implant boron atoms into part of the polysilicon layer so that part of the polysilicon body and the adjacent contacts would have different etching selectivity. By carrying out these two steps, the aforementioned drawbacks such as lateral over-etching of polysilicon layer and conductive residue are improved substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate having a transistor region and a resistor region;
    forming a shallow trench isolation (STI) on the resistor region of the substrate;
    forming a tank in the STI; and
    forming a resistor in the tank and on two sides of the top surface of the STI outside the tank.

2. The method of claim 1, wherein after forming the tank comprises:
    forming an interfacial layer, a high-k dielectric layer, a barrier layer, and a polysilicon layer on the substrate;
    performing an ion implantation process to implant a dopant into part of the polysilicon layer; and
    patterning the interfacial layer, the high-k dielectric layer, the barrier layer, and the polysilicon layer to form a gate in the transistor region and a resistor in the resistor region.

3. The method of claim 2, wherein the dopant comprise boron atoms.

4. The method of claim 2, further comprising:
    forming at least one spacer on the sidewalls of the gate and the resistor; and
    forming a source/drain in the substrate adjacent to two sides of the spacer of the gate.

5. The method of claim 4, further comprising:
    forming a contact etch stop layer (CESL) to cover the gate and the resistor;
    forming a first dielectric layer to cover the CESL;
    performing a first planarizing process to partially remove the first dielectric layer and the CESL; and
    performing an etching back process to expose the top of the gate, the surface of CESL on the polysilicon layer in the tank and the CESL on the polysilicon layer adjacent to two sides of the tank.

6. The method of claim 5, further comprising:
    performing a dry etching process to remove the polysilicon layer implanted with dopant in the transistor region and the resistor region;
    performing a wet etching process to remove the polysilicon layer not implanted with dopant for forming a plurality of openings in the transistor region and the resistor region;
    forming a work function metal layer and a conductive layer to fill the openings; and
    performing a second planarizing process to partially remove the work function metal layer and the conductive layer such that the surface of the conductive layer being even with the surface of the first dielectric layer for forming a metal gate in the transistor region and a plurality of contacts adjacent to two sides of the tank in the resistor region.

7. The method of claim 6, further comprising:
forming a passivation layer on the first dielectric layer;
forming a second dielectric layer on the passivation layer; and
forming a plurality of contact plugs in the passivation layer and the second dielectric layer for connecting the metal gate and the contacts.

8. The method of claim 7, wherein the passivation layer comprises TiAlO or SiCN.

* * * * *